United States Patent [19]
Pasotti et al.

[11] Patent Number: 6,011,715
[45] Date of Patent: Jan. 4, 2000

[54] METHOD FOR MULTILEVEL PROGRAMMING OF A NONVOLATILE MEMORY, AND A MULTILEVEL NONVOLATILE MEMORY

[75] Inventors: Marco Pasotti, S. Martino Siccomario; Pier Luigi Rolandi, Monleale; Roberto Canegallo, Tortona; Danilo Gerna, Montagna In Valtellina; Ernestina Chioffi, Pavia, all of Italy

[73] Assignee: STMicroelectronics S.r.l., Agrate Brianza, Italy

[21] Appl. No.: 09/185,906

[22] Filed: Nov. 3, 1998

[30] Foreign Application Priority Data

Nov. 3, 1997 [EP] European Pat. Off. .............. 97830566

[51] Int. Cl.$^7$ ..................................................... G11C 7/00
[52] U.S. Cl. ............................... 365/185.03; 365/185.19; 365/185.24
[58] Field of Search ......................... 365/185.03, 185.19, 365/185.24, 185.22

[56] References Cited

U.S. PATENT DOCUMENTS

| | | | |
|---|---|---|---|
| 5,394,362 | 2/1995 | Banks | 365/189.01 |
| 5,629,890 | 5/1997 | Engh | 365/185.03 |
| 5,757,699 | 5/1998 | Takeshima et al. | 365/185.03 X |
| 5,801,989 | 9/1998 | Lee et al. | 365/185.19 X |
| 5,838,612 | 11/1998 | Calligaro et al. | 365/185.03 |
| 5,880,993 | 3/1999 | Kramer et al. | 365/185.03 X |

FOREIGN PATENT DOCUMENTS

0 763 828 A2  3/1997  European Pat. Off. .
WO 96/14638  5/1996  WIPO .

OTHER PUBLICATIONS

Pier Luigi Rolandi et al., "Analog Flash Memoray for HIgh–Density Digital Storage," *SGS–Thomson Microelectronics Innovative Systems Design Group—Central R&D*, 1–10, 1997.

Hieu Van Tran et al., "A 2.5V 256–Level Non–Volatile Analog Storage Device Using EEPROM Technology," in *IEEE International Solid–State Circuits Conference*, FP 16.6, 270–271. 1996.

Kang–Deog Suh et al. "A 3.3V 32Mb NAND Flash Memory with Incremental Step Pulse Programming Scheme," in *IEEE International Solid–State Circuits Conference*, TA 7.5, 128–129, 1995.

M. Bauer et al., "Amultilevel–Cell 32Mb Flash Memory," in *IEEE International Solid–State Circuits Conference*, TA 7.7, 132–133, 1995.

*Primary Examiner*—Do Hyun Yoo
*Attorney, Agent, or Firm*—Theodore E. Gallanthay; David V. Carlson; Seed and Berry LLP

[57] ABSTRACT

A programming method for a nonvolatile memory includes the steps of: a) determining a current value of the threshold voltage; b) acquiring a target value of the threshold voltage; c) calculating a first number of gate voltage pulses necessary to take the threshold voltage from the current value to the target value; d) applying a second number of consecutive voltage pulses to the gate terminal of the cell, the second number being correlated to the first number and having a uniformly increasing amplitude; e) then measuring a current value of the threshold voltage; and repeating steps c) to e) until a final threshold value is obtained.

20 Claims, 3 Drawing Sheets

6,011,715

METHOD FOR MULTILEVEL PROGRAMMING OF A NONVOLATILE MEMORY, AND A MULTILEVEL NONVOLATILE MEMORY

TECHNICAL FIELD

The present invention relates to a method for multilevel programming of a nonvolatile memory, and a multilevel nonvolatile memory.

BACKGROUND OF THE INVENTION

As is known, at present, the cells of a nonvolatile memory, in particular a flash memory, are programmed by biasing the gate terminal of the cell to be written (by means of a word line) to a first predetermined potential (for example, 8–9 V), the drain terminal to a second predetermined potential (for example, 5 V), and the source terminal to ground. Thus, by hot electron injection, electrons are trapped in the floating gate region of the cell, and therefore the threshold voltage of the cell is modified.

SUMMARY OF THE INVENTION

By its very nature, the phenomenon of hot electron injection is uncontrolled and cannot be repeated with precision; consequently, programming is carried out by providing a plurality of programming pulses and reading the threshold voltage of the cell after each programming pulse (verifying step), to evaluate whether the required value has been reached, and decide whether to apply further programming pulses.

Now, high-density digital data storage techniques are being designed (which can provide more than eight levels); these techniques require the use of feedback circuits in the programming circuitry (designed to provide the programming pulses and carry out the verify step), which however make the verify step slower and lengthen programming, which altogether can comprise 70–100 verify steps.

One object of the invention is thus to provide a method and a memory that permit analog or multilevel programming which is highly accurate, but nevertheless fast.

One aspect of the present invention provides a multilevel programming method for a nonvolatile memory, and a multilevel nonvolatile memory, as defined, for example, respectively in claim 1 and claim 7.

BRIEF DESCRIPTION OF THE DRAWINGS

For understanding the present invention, a preferred embodiment is now described, purely by way of non-limiting example, with reference to the attached drawings.

DETAILED DESCRIPTION OF THE INVENTION

The present invention is based on the finding that when a series of programming voltage pulses with a linearly increasing amplitude (discrete ramp comprising a plurality of constant amplitude steps) is applied to the gate terminal of a cell to be programmed, after a given time, necessary for the system to achieve equilibrium, the threshold voltage of the cell increases in the same manner as the programming voltage, i.e., if $\Delta V_G$ is the increment of the programming voltage applied to the gate terminal of the cell at each pulse, the obtainable increment of the threshold voltage $\Delta V_{th}$ is equal to:

$$\Delta V_{th} = \Delta V_G$$

as shown, for example, in "Technological and design constraints for multilevel flash memories" by C. Calligaro, A. Manstretta, A. Modelli, G. Torelli, *Proceedings of International Conference on Electronic Circuits and Systems*, Rhodes, Greece, 1996, p. 1003.

Consequently, once the increase speed of the gate voltage (i.e., slope defined by successive programming voltage pulses) has been set, highly accurate reading of the initial threshold value of the cell to be programmed makes it possible, based on the target threshold voltage value, to find out the time necessary to reach this target value. Based on the (predetermined) duration of the programming pulses, it is thus possible to calculate the number of programming pulses that are necessary for cell programming. Consequently, it is no longer necessary to carry out a verify step after each application of a programming pulse, but the reached threshold voltage level needs to be verified only a limited number of times, ideally only after application of all the previously determined programming pulses.

In practice, since calculation of the number of necessary pulses is correct only after equilibrium has been reached, and since account must be taken of inaccuracy conditions, according to one embodiment of the present method, a first sequence of pulses is initially applied, to take the cell into an equilibrium condition; a verify read is then carried out to identify the value of the current threshold voltage of the cell; the number of pulses necessary to obtain the target threshold value is calculated; a number of pulses which is close to the number of pulses just calculated is applied, to avoid cell overwriting; the current threshold value is verified out once more; the number of pulses necessary to obtain the target threshold voltage is calculated; the just calculated number of pulses is applied; and verify read is carried out once more, optionally followed by further steps of applying programming pulses and verifying.

Thereby, with 3–5 verifying steps, it is possible to program the cell accurately, considerably reducing the programming times compared with the standard method.

The aforementioned programming method will be described hereinafter in more detail, after description of an embodiment of the present memory.

Figure 1:
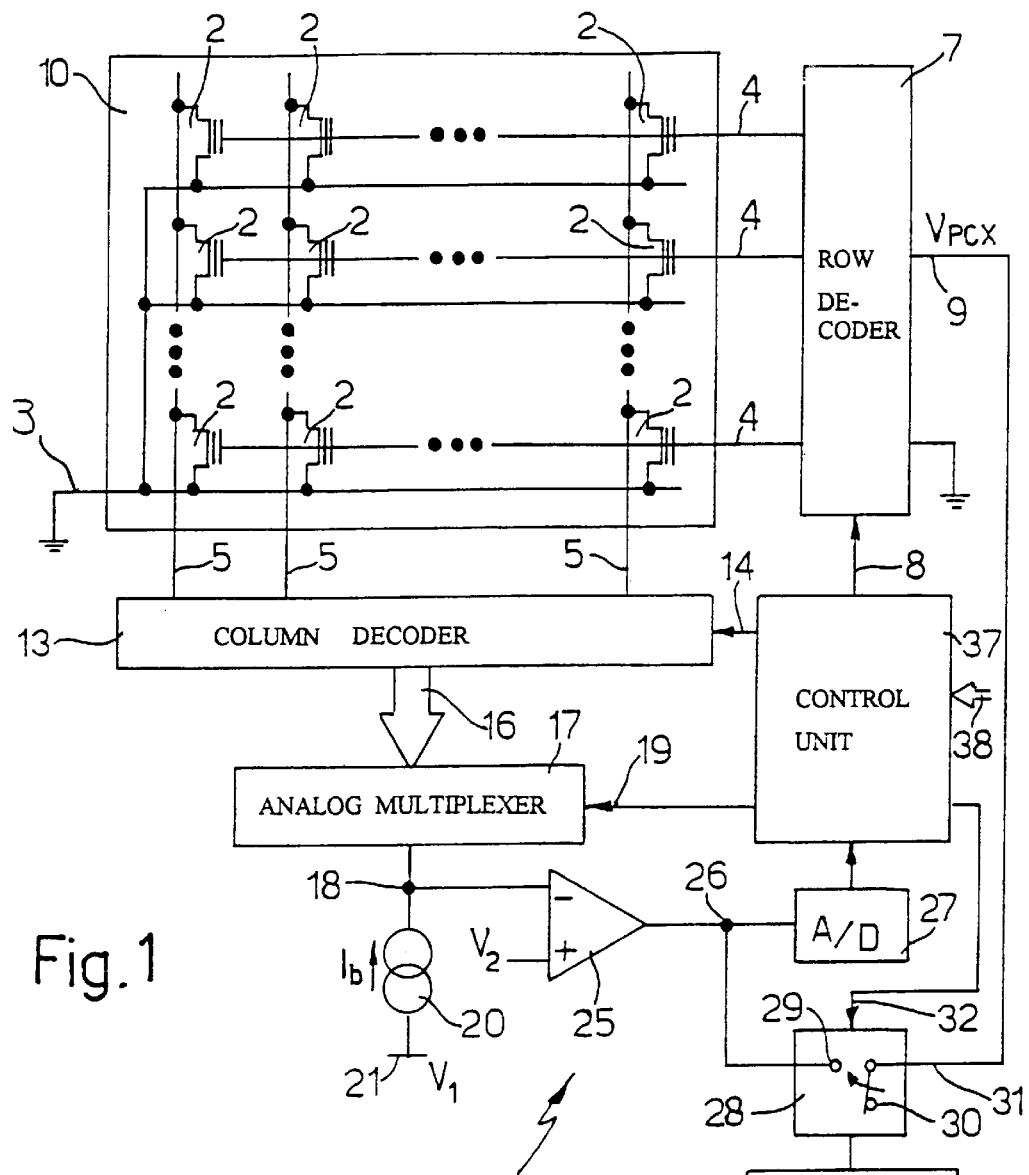
FIG. 1 shows the block diagram of a flash memory according to one embodiment of the present invention.

FIG. 1 shows a sector 10 of an analog memory 1 and the components of the memory 1 which intervene in the programming step. In particular, sector 10 comprises a plurality of cells 2 arranged on rows and columns; the control gate terminals of the cells 2 disposed on a same row are connected to one another by a word line 4, the drain terminals of the cell 2 disposed on a same column are connected to one another by a bit line 5, and the source terminals of all the cells 2 are connected to one another and are available externally (in the example illustrated, during the programming step, they are connected to ground line 3).

The word lines 4 are connected to a row decoder 7, which has a control input 8 receiving address signals, and a bias input 9 receiving the voltage $V_{pcx}$. In known manner, the row decoder 7 biases a word line 4 at a time to voltage $V_{pcx}$, as specified by the address signals provided to control input 8.

The bit lines 5 are connected to a column decoder 13, which, as specified by address signals provided to a control input 14 thereof, connects selectively the bit lines 5 in a known manner to a bus 16 consisting of eight lines; the bus 16 is then connected to an analog multiplexer 17, having the function of connecting a single one of the bus 16 lines to an output node 18, on the basis of a control signal provided to a control input 19.

Node 18 is connected to a first terminal of a current source 20, which has a second terminal connected to a reference line 21, set to a voltage $V_1$, and generates a bias current $I_b$; node 18 is also connected to an inverting input of an operational amplifier 25, having a non-inverting input which receives a reference voltage $V_2$. The output of the operational amplifier 25 defines a node 26 connected to an input of an analog/digital converter 27, and to a first input 29 of a two-position switch 28; the switch has a second input 30 connected to a discrete ramp generator 34, and an output 31 connected to the bias input 9 of row decoder 7.

The output of the A/D converter 27 is fed to a control logic unit 37 having an input 38 communicating with not shown components of the memory 1 (to receive the programming instructions, the addresses of the cells to be written, and the threshold values to which the cells must be programmed), and a plurality of outputs which are connected to the inputs 8, 14, 19, and to a selection input 32 of the switch 28.

When one or more cells 2 of the sector 10 are to be programmed, control logic unit 37 controls switch 28 such as to connect output 31 to second input 30, i.e., such that voltage $V_{pcx}$ fed to the input of decoder 7 increases as determined by ramp generator 34. In addition, the control logic unit 37 controls row decoder 7 and column decoder 13 such that the latter supply voltage $V_{pcx}$ to the selected word line 4, to which the programming cell is connected, and, respectively, the target drain voltage to the selected bit line 5, to which the cell to be programmed is connected, in a known manner.

At the end of the planned programming pulses sequence, control logic unit 37 controls switch 28 such as to connect output node 26 of operational amplifier 25 to first input 29, which, in turn, is connected to output 31 and thus to selected word line 4. In practice, in this situation, there is direct connection between the selected bit line 5 and the inverting input of the operational amplifier 25, as well as between the output 26 of the operational amplifier 25 and the selected word line 4, forming a feedback loop that includes the cell 2 and the operational amplifier 25. In this condition, as described in detail in European Patent Application No. 96830612.6 dated May 12, 1996 filed in the name of the same applicant, at the output 26 of the operational amplifier 25 a voltage $V_o$ is present which is proportional to the current threshold voltage of the selected cell 2. This is also explained in corresponding U.S. patent application No. 08/941,882, which was allowed on Aug. 27, 1998, and which is incorporated herein by reference. In fact, as explained in detail in the prior patent application, the current $I_D$ flowing in a memory cell of the considered type, is equal to:

$$I_D = K(V_{ov})^2 = K(V_{gs} - V_{th})^2 \quad (1)$$

wherein K is a constant dependent on the production process, and $V_{ov}$ is the overdrive voltage of the cell, i.e., the difference between the voltage applied across the source and drain terminals of the cell ($V_{gs}$) and its threshold voltage ($V_{th}$). In the configuration of FIG. 1, in the verify step, the current flowing in the cell is constant and is equal to the bias current $I_b$ set by the current source 20. Thus the overdrive voltage $V_{ov}$ is constant even if the threshold voltage of the cell varies. It is therefore possible to write $$V_{ov} = K_1 \quad (2)$$

In addition, by virtue of the above-described closed loop connection, in an equilibrium condition, the voltage present at the inverting input 18 of the operational amplifier 25 (and thus on the selected bit line 5) is equal to the reference voltage $V_2$, and the output voltage $V_o$ of the operational amplifier 25 is the same as the voltage $V_{gs}$ of the cell.

In addition, the following is obtained:

$$V_{gs} = V_{ov} + V_{th} = K_1 + V_{th} = V_o \quad (3)$$

thus the output voltage of the operational amplifier 25 provides the threshold voltage value of the cell 2, minus the constant term $K_1$ which depends on the bias current and on the parameters of the cell, and is thus known. In addition, owing to the linear relationship between $V_o$ and $V_{th}$, and by reading the cell 2 with the same feedback loop, it is possible to use output voltage $V_o$ directly as a threshold voltage of the cell, which is comparable with the target value.

On receipt of the output voltage $V_o$ of the operational amplifier 25, the control logic unit 37 can thus directly calculate the threshold voltage value of (3), for determining the number of programming pulses of each sequence.

Figure 2:
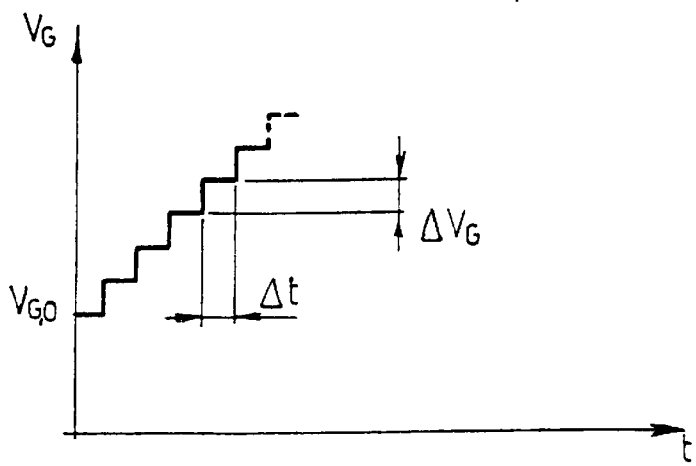
FIGS. 2–4 show plots relating to the present method.
Figure 3:
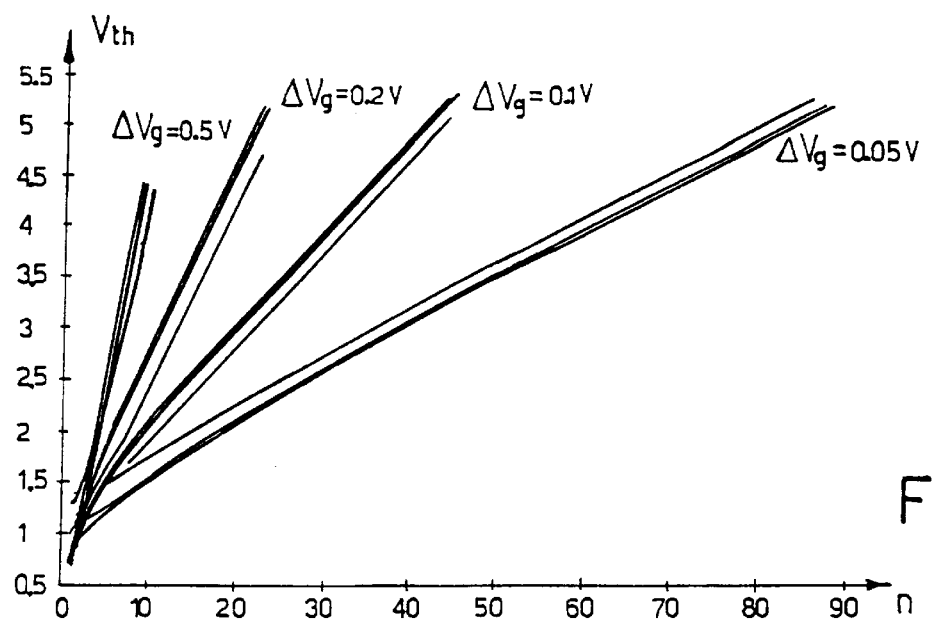
Figure 4:
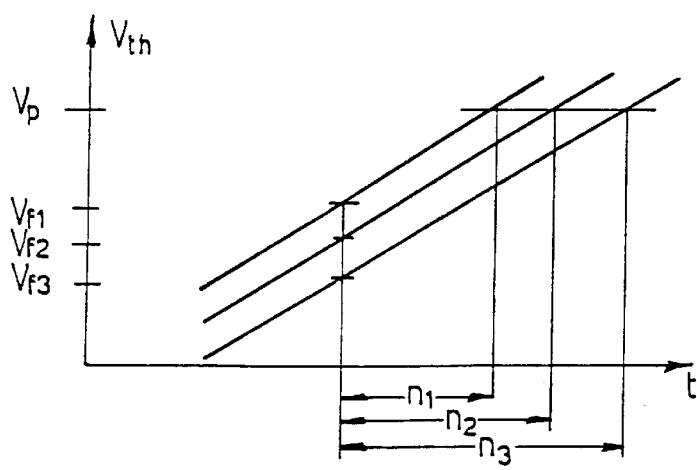

Before describing in detail an embodiment of the present programming method, reference is made to FIGS. 2–4.

FIG. 2 shows the progression of the programming pulses applied according to the present method, wherein gate voltage $V_G$ is shown on the y axis, and time t is shown on the x axis. In particular, starting from an initial value $V_{G,o}$, which is not too high (for example, 2V), a sequence of successive pulses with amplitude $\Delta V_G$ and duration $\Delta t$ is applied to the gate terminal of cell 2 to be programmed. Advantageously, amplitude $\Delta V_G$ is selected on the basis of the accuracy to be obtained (for example, 50 mV), and duration of the pulses is determined in the design step (and is, for example, between 0.5 and 2 $\mu$s). Thereby, the slope $m = \Delta V_G/\Delta t$ of the gate voltage ramp is established, and thus the increase speed of the gate threshold voltage.

FIG. 3 shows a plot showing the behavior of threshold voltage $V_{th}$, as a function of the pulse number n applied to the gate terminal of a cell 2 (i.e., in accordance with the programming time, since the pulse duration is constant and predetermined, as already stated) in the case of programming by applying an increasing gate voltage with uniform steps, for different values of the steps $\Delta V_G$, i.e., for different slopes m.

FIG. 4 shows the plot of the threshold voltage $V_{th}$ in case of programming by applying an increasing gate voltage with uniform steps, for a same ramp slope and three different threshold voltage initial values $V_{fi}$ in particular, it shows the different programming pulse numbers n1, n2, n3 necessary to obtain a single target threshold voltage $V_p$. From this figure, it can be seen that:

$$V_p = V_{fi} + mT \quad (4)$$

wherein $V_{fi}$ is the generic initial value of the threshold voltage, m is the above-defined slope, and T is the total programming time.

From (4) it can be seen that $$T = (V_p - V_{fi})/m \quad (5)$$

and, considering that $T = n\Delta t$ (in which n is the number of programming pulses, and $\Delta t$ is the duration of each pulse) and $m = \Delta V_G/\Delta t$, the following is obtained:

$$n = (V_p - V_{fi})/\Delta V_G \quad (6)$$

which makes it possible to calculate the number of programming pulses necessary to obtain the target threshold voltage from a known initial threshold voltage, with a specific progression (step amplitude) of the gate voltage.

Based on the above, an embodiment of the present method is now described with reference to FIG. 5. According to the flow chart of FIG. 5, initially (block 100), control logic unit 37 is supplied with data necessary for programming a predetermined array cell 2, addressed in known manner by the row 7 and column decoders 13. In particular, the intermediate voltage value $V_{int}$ to which the threshold voltage of the cell 2 is to be brought, to go into the linear zone, the amplitude $\Delta V_G$ of the programming pulses, and the final target threshold voltage $V_p$ are supplied. Thus, control logic unit 37 commands a verify read of cell 2 (block 110), generating a logic level (for example, a "0") of the switching signal supplied to input 32 of switch 28, such as to connect the output of the operational amplifier 25 to the selected word line 4, and thus gets output voltage $V_o$ on node 26, representing the initial threshold value $V_{fi}$.

Subsequently (block 120), control logic unit 37 calculates the pulse number N1 necessary to obtain the intermediate threshold voltage $V_{int}$ on the basis of (6), and commands (block 130) transmission of the N1 pulses by means of the selector 28. Subsequently, in the same manner as described above, another verify read is carried out, and the output voltage $V_o$ is acquired at the node 26, representing the current threshold voltage $V_{eff}$ of the cell 2 (block 140).

On the basis of the acquired value $V_{eff}$, control logic unit 37 calculates the pulse number N2 necessary to obtain the final threshold voltage $V_p$, less one, for sake of security (block 150), and controls transmission of the N2 pulses (block 160). Then, a further verify read is carried out, the current threshold value $V_{eff}$ (block 170) is acquired, and the number N3 of pulses is calculated as necessary to obtain the final threshold voltage $V_p$ (block 180). The N3 pulses are applied (block 190), and a further verifying step is carried out, with acquisition of the current threshold value $V_{eff}$ (200).

It is then verified whether the current threshold value $V_{eff}$ is equal to the target threshold value, within the required accuracy level (block 210); if this is the case, the programming process ends; otherwise, the program returns to block 180, for calculating the pulses that are still necessary to achieve the threshold and for verifying.

Figure 6:
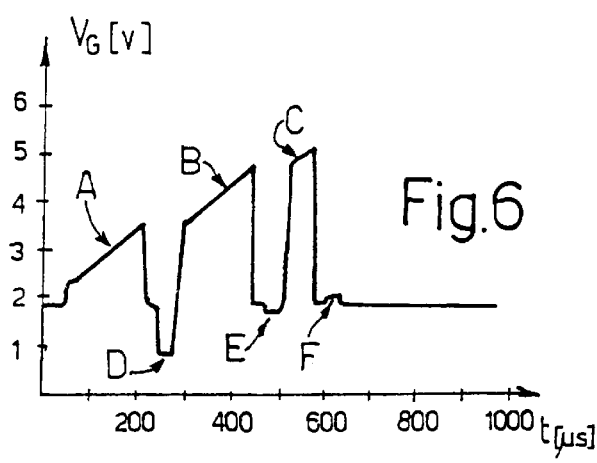
FIGS. 6 and 7 show plots which can be obtained by means of the present method.
Figure 5:
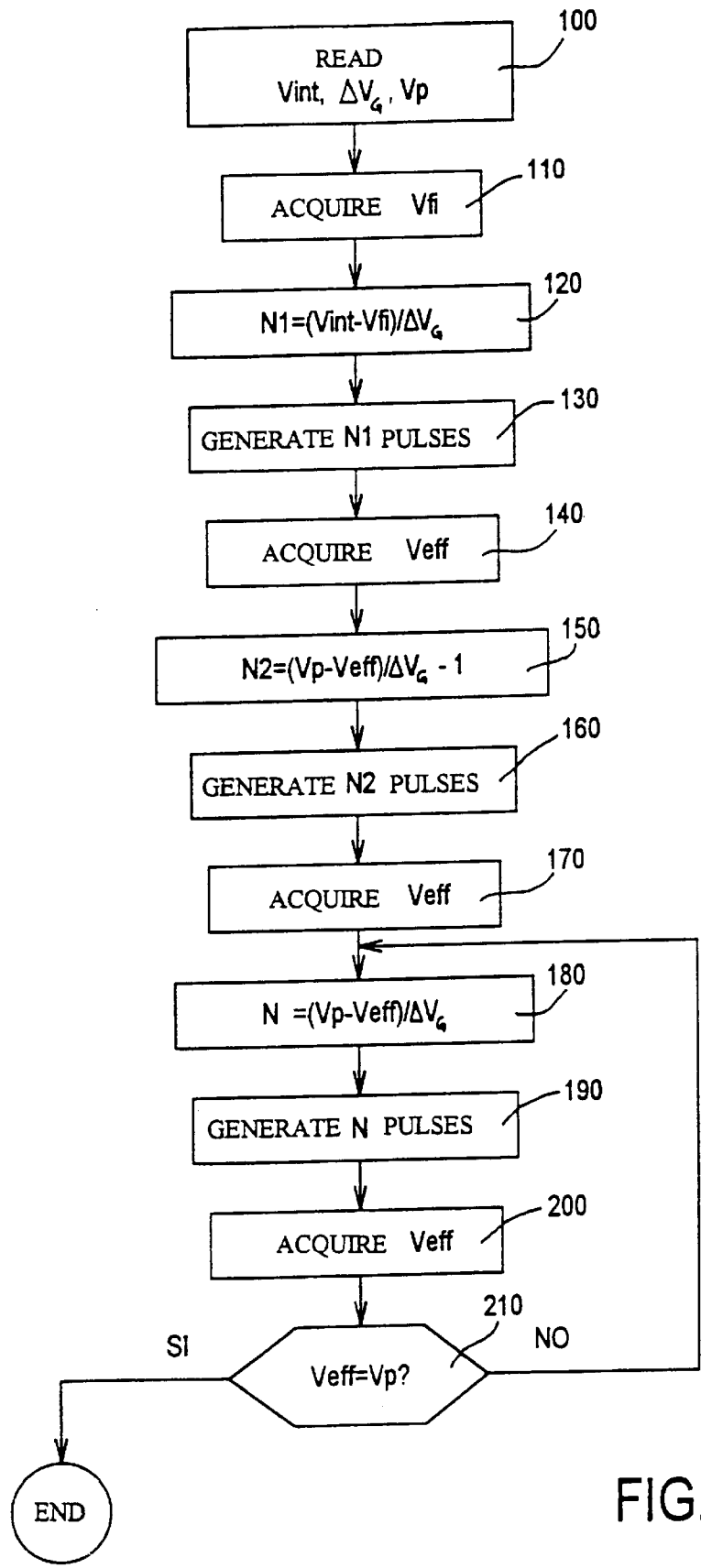
FIG. 5 shows a flow chart relating to the operations of the present method.

FIG. 6 shows the plot of gate voltage $V_G$ on a cell 2 during programming according to the algorithm of FIG. 5, as determined by an oscilloscope; in this figure, regions A, B, C indicate the increasing amplitude pulse sequence applying steps, and D, E, and F identify the verifying steps. At F, the target threshold value has been obtained, and programming is stopped. As can be seen, programming of the cell 2 has required only three verifying steps, and target threshold voltage has been obtained with a programming accuracy of approximately 50 mV. In addition, the value of the gate voltage $V_G$ at points D, E and F represents the obtained threshold voltage, less the constant $K_1$, according to equation (3).

Figure 7:
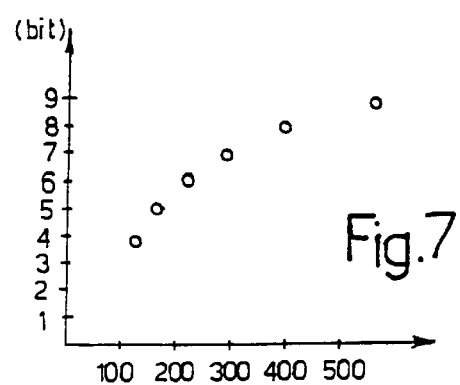

Finally, FIG. 7 shows the dependency between the programming speed and the accuracy; in particular, the x axis shows the total programming time (which is dependent on the amplitude of each pulse, as can be seen immediately from FIG. 3) and the y axis shows the analog accuracy (measured in bits). As can be seen, faster programming curves are more difficult to foresee accurately, and thus cause a programming accuracy loss. Consequently, on the basis of the specific design requirements, it is possible to set the best compromise between programming speed and accuracy.

Finally, it is apparent that numerous modifications and variants can be made to the described and illustrated method and memory, all of which come within the scope of the invention, as defined in the attached claims. In particular, the criteria for calculating the pulse number in each sequence can be different from those described; for example, the first pulse sequence can comprise a priori predetermined pulse number, instead of being calculated as described above; the manner of generating the programming pulses can differ from that shown in FIG. 1, for example, instead of the ramp generator 34, a digital/analog converter can be provided, which is controlled directly by the control logic unit 37, providing the converter with a digital value of the gate voltage amplitude to be supplied to the addressed word line at steps in blocks 130, 160, 190.

We claim:

1. A method for multilevel programming of a nonvolatile memory, comprising a cell having a gate terminal and a threshold voltage, comprising:

determining a current value of said threshold voltage;

acquiring a target value of said threshold voltage;

calculating a first number of gate voltage pulses having uniformly increasing amplitudes necessary to take said threshold voltage from said current value to said target value; and applying a second number of consecutive voltage pulses, to said gate terminal, said second number being other than one, and correlated to said first number of voltage pulses.

2. A method according to claim 1 further comprising measuring a current value of said threshold voltage after applying the second number of consecutive voltage pulses.

3. A method according to claim 2 wherein the acts of calculating a first number of gate voltage pulses through measuring a current value of said threshold voltage are repeated until a final threshold value is obtained.

4. A method according to claim 1 further comprising applying a third predetermined number of consecutive gate voltage pulses before determining a current value of said threshold voltage.

5. A method according to claim 1 wherein said second number is equal to said first number, less a predetermined value.

6. A method according to claim 1 wherein each pulse has a constant predetermined amplitude increment with respect to an immediately preceding pulse and said first number is obtained as the difference between said target value and said current value divided by said constant predetermined amplitude increment.

7. A multilevel nonvolatile memory comprising:

a plurality of cells each with a gate terminal and a threshold voltage;

a generator means for generating a ramp voltage, to be connected to said gate terminal;

a measure means for measuring a current value of the threshold voltage of said cell;

an acquisition means for acquiring a target value of said threshold voltage; and a control unit connected to said generator means and said measure means comprising, a first calculation means for calculating a first voltage pulse number necessary to take said threshold voltage from said current value to said target value;

a second calculation means for calculating a second voltage pulse number, said second voltage pulse number being different from one and correlated to said first voltage pulse number; and a sequential enable means for repeatedly and consecutively enabling said generator means to apply said second voltage pulse number to said gate terminal.

8. A memory according to claim 7 wherein said measure means comprises:

a feedback circuit including a constant current source, connectable to a terminal of said cell; and an operational amplifier having a first input connectable to said terminal of said cell, a second input receiving a reference voltage, and an output connectable to said gate terminal of said cell.

9. A memory according to claim 8 further comprising a selector means controlled by said control unit and selectively connecting said gate terminal of said cell to said output of said operational amplifier and to said generator means.

10. A memory according to claim 8 further comprising an analog/digital converter between said output of said operational amplifier and said control unit.

11. A memory according to claim 7 wherein said control unit comprises said acquisition means, said measure means, said first and second calculation means, and said sequential enable means.

12. A memory according to claim 7 wherein each pulse has a constant predetermined amplitude increment with respect to an immediately preceding pulse and said first calculation means comprises subtractor means calculating the difference between said target value and said current value, and division means dividing said difference by said constant predetermined amplitude increment.

13. A memory according to claim 7 wherein said second calculation means comprises subtractor means subtracting a predetermined value from said first number.

14. A multilevel nonvolatile memory, comprising:

a plurality of memory cells, each memory cell including a gate terminal and having an associated threshold voltage;

a generator circuit developing a programming voltage on an output;

a sensing circuit that senses a current value of the threshold voltage of a selected memory cell, and generates an output signal corresponding to the sensed current value of the threshold voltage; and a control unit coupled to the generator circuit and sensing circuit, the control unit coupling the sensing circuit to the selected memory cell and calculating a first voltage pulse number responsive to the output signal from the sensing circuit and a desired value for the threshold voltage of the selected memory cell, calculating a second voltage pulse number responsive to the first voltage pulse number, and coupling the output of the generator circuit to the gate terminal of the selected memory cell to apply the second voltage pulse number of pulses to program the threshold voltage to its desired value.

15. The memory of claim 14 wherein the sensing circuit comprises:

a feedback circuit including a constant current source coupled to a terminal of the selected memory cell; and an operational amplifier having a first input coupled to the terminal of the selected memory cell, a second input adapted to receive a reference voltage, and an output coupled to the gate terminal of the selected memory cell.

16. The memory of claim 15 further comprising a coupling circuit including a first signal terminal coupled to the output of the operational amplifier, a second signal terminal coupled to the output of the generator circuit, a third signal terminal coupled to the gate terminal of the selected memory cell, and a control terminal coupled to the control unit, the coupling circuit coupling the first signal terminal to the third signal terminal when the control unit activates a control signal applied on the control terminal, and coupling the second signal terminal to the third signal terminal when the control unit deactivates the control signal.

17. The memory of claim 15 further comprising an analog-to-digital converter coupled between the output of the operational amplifier and the control unit.

18. The memory of claim 14 wherein the control unit comprises:

a subtraction circuit calculating the difference between the desired value and the current value of the threshold voltage of the selected memory cell; and a division circuit that divides the difference between the desired value and the current value of the threshold voltage of the selected memory cell by a constant predetermined amplitude increment of successive pulses from the generator circuit.

19. The memory of claim 14 wherein the control unit calculates the second voltage pulse number by subtracting a predetermined value from the first voltage pulse number.

20. The memory of claim 14 wherein the control unit repetitively calculates the first voltage pulse number responsive to the output signal from the sensing circuit and applies the output of the generator circuit to the gate terminal of the selected memory cell until the associated threshold voltage is programmed to its desired value.

* * * * *